(12) United States Patent
Zheng et al.

(10) Patent No.: US 7,268,582 B1
(45) Date of Patent: Sep. 11, 2007

(54) DPRIO FOR EMBEDDED HARD IP

(75) Inventors: Michael M Zheng, Fremont, CA (US);
Binh Ton, San Jose, CA (US); Chong H Lee, San Ramon, CA (US)

(73) Assignee: Altera Corporation, San Jose, CA (US)

( * ) Notice: Subject to any disclaimer, the term of this patent is extended or adjusted under 35 U.S.C. 154(b) by 4 days.

(21) Appl. No.: 11/286,038

(22) Filed: Nov. 22, 2005

(51) Int. Cl.
*H03K 19/173* (2006.01)
(52) U.S. Cl. .......................................... 326/38; 326/41
(58) Field of Classification Search ............ 326/37–41; 713/1, 2
See application file for complete search history.

(56) References Cited

U.S. PATENT DOCUMENTS

| | | | |
|---|---|---|---|
| 5,689,195 A | 11/1997 | Cliff et al. | |
| 5,909,126 A | 6/1999 | Cliff et al. | |
| 6,215,326 B1 | 4/2001 | Jefferson et al. | |
| 6,407,576 B1 | 6/2002 | Ngai et al. | |
| 6,650,140 B2 | 11/2003 | Lee et al. | |
| 7,162,553 B1 * | 1/2007 | Xue et al. | 710/71 |
| 2001/0033188 A1 | 10/2001 | Aung et al. | |
| 2006/0033527 A1 * | 2/2006 | Lee et al. | 326/41 |
| 2006/0095613 A1 * | 5/2006 | Venkata et al. | 710/62 |

* cited by examiner

*Primary Examiner*—Don Le
(74) *Attorney, Agent, or Firm*—Fish & Neave IP Group of Ropes & Gray LLP; Brian E. Mack

(57) ABSTRACT

An I/O interface for configuring hard IP embedded in a FPGA includes a register load signal, a CSR initialization signal, and a register data signal. After programming the DPRIO registers, the register data controls the operation of the hard IP block. The interface supports both CSR load mode and the MDIO interface. The user-friendly I/O interface eliminates all requirements on the end-user and is virtually transparent to the end-user.

19 Claims, 8 Drawing Sheets

DPRIO FOR EMBEDDED HARD IP

BACKGROUND OF THE INVENTION

This invention relates generally to field programmable gate array ("FPGA") integrated circuit devices, such as programmable logic devices ("PLDs"), and more particularly to interface circuitry for configuring an embedded hard IP block in a FPGA device and related operating methods for such circuitry.

FPGAs are well-known devices as shown, for example, by such references as Cliff et al. U.S. Pat. No. 5,689,195, Cliff et al. U.S. Pat. No. 5,909,126, Jefferson et al. U.S. Pat. No. 6,215,326, and Ngai et al. U.S. Pat. No. 6,407,576. In general, an FPGA is a general-purpose integrated circuit device that is programmable to perform any of a wide range of logic tasks. FPGA technology is well-known for its ability to allow one common hardware design to be programmed to meet the needs of many different applications. Rather than having to design and build separate logic circuits for performing different logic tasks, general-purpose FPGAs can be programmed in various different ways to perform those various logic tasks. Many manufacturers of electronic circuitry and systems find FPGAs to be an advantageous way to provide system components because they can be manufactured in large quantities at low cost.

To facilitate the use of programmable logic resources in certain applications, hard intellectual property ("hard IP") blocks, or design blocks represented as mask layouts, may be coupled to programmable logic resource core circuitry. Data from circuitry external is typically sent to a programmable logic resource through a particular pin and to a corresponding I/O port where the data is decoded and sent to a corresponding data port in the IP block for processing. Similarly, data from the IP block is typically sent to circuitry external to the package through a data port to a corresponding I/O port where the data is encoded and sent to a corresponding pin for output.

The performance of FPGA architectures has increased remarkably in recent years due, in part, to reuse at the layout level of hard IP blocks. Advantages of hard IP reuse are numerous, including the ability to optimize the hard IP directly at the layout level, which enables faster design. Hard IP reuse can also accelerate a product's time to market by migrating a cell library or a block from an old design into a new design.

FPGA integrated circuit devices with embedded hard IP blocks are now used in a multitude of high-speed applications, such as high-speed serial interfaces ("HSSIs"). These interfaces often process serial input data at rates in excess of several Gpbs. For example, Lee et al. U.S. Pat. No. 6,650,140, shows a PLD that includes HSSI circuitry that can support several high speed serial ("HSS") standards.

To support increasing demands for dynamic, on-the-fly hard IP configuration, a separate configuration register bank is provided. Modeled after the MDIO (Management Data I/O) interface common in Ethernet standards, this new hard IP configuration interface is referred to as Dynamic Partial Reconfigurable I/O ("DPRIO"). Many hard IP control signal I/Os that can tolerate the latency of dynamic reconfiguration—after power-up and FPGA programming, but during normal functional mode—have been removed and are now controlled by DPRIO, thus saving valuable interface pins on the FPGA fabric side. Particularly for use with embedded hard IP devices that have a large number of configurations, it would be highly desirable to have an elegant, robust, and user-friendly DPRIO interface solution for dynamically reconfiguring embedded hard IP blocks.

SUMMARY OF THE INVENTION

In accordance with embodiments of the invention, DPRIO core circuitry is operative to output serial control signals from at least one input interface to an embedded hard IP block. DPRIO core circuitry is also operative to program DPRIO configuration registers based on the Control and Status Register ("CSR") load data, which may be controlled by the FPGA control block.

DPRIO control circuitry also receives control signals indicative of several modes of operation. Depending on which mode of operation is selected, DPRIO core circuitry may shift input data out to DPRIO configuration registers or output signals from one of the DPRIO input interfaces to a hard IP block.

The invention also includes methods of operating circuitry of the types summarized above.

Further features of the invention, its nature and various advantages, will become more apparent from the accompanying drawings and the following detailed description.

DETAILED DESCRIPTION

Figure 1:
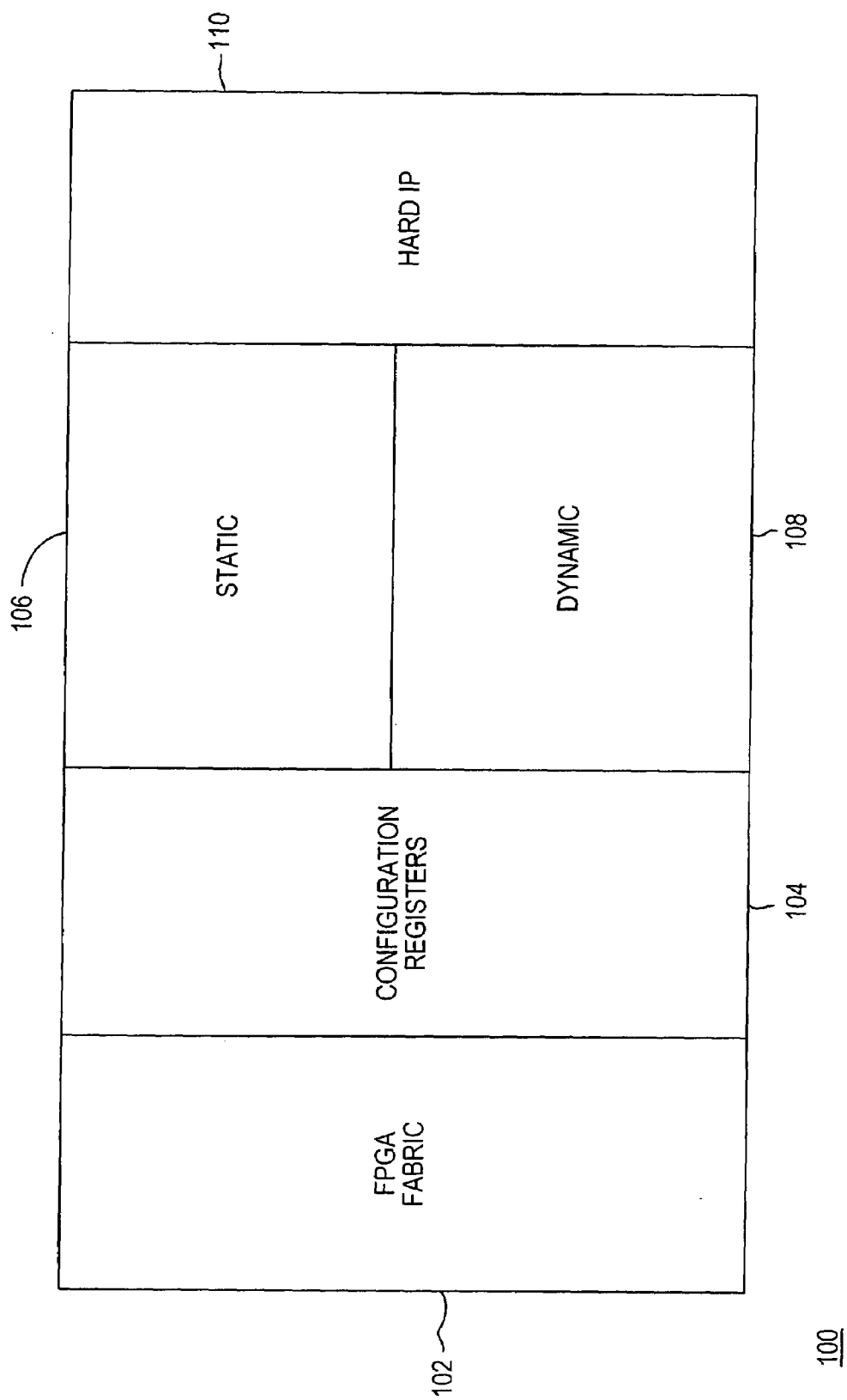
FIG. 1 is a simplified block diagram of an illustrative DPRIO configuration interface in accordance with the invention.

Illustrative DPRIO interface 100 in accordance with the invention is shown in FIG. 1. Hard IP block 110 may be any embedded hard IP block, including a HSSI. Although in the preferred embodiment, hard IP block 110 is embedded in a FPGA, hard IP block 110 may also be embedded in one or more PLDs or PLAs/PALs in other embodiments.

Hard IP block 110 may be configured to operate using a large amount of configuration data. For example, a hard IP implementation of a HSSI may require close to 2000 bits of configuration data. This large amount of configuration data is used to control and manipulate a number of HSSI features, from the termination resistor calibration to the interface width at the hard IP-FPGA fabric interface. To support dynamic configuration and reconfiguration of some features of hard IP block 110, separate configuration registers 104 are provided to store the hard IP configuration data. Some of this configuration data may be static configuration data 106. However, to support on-the-fly configuration and reconfiguration, an increasingly important type of this configuration data may be dynamic configuration data 108. Providing separate configuration registers 104 for hard IP block 110 saves interface pins on FPGA fabric 102 because many hard IP control signal I/Os have been removed and are now controlled by DPRIO.

Figure 2:
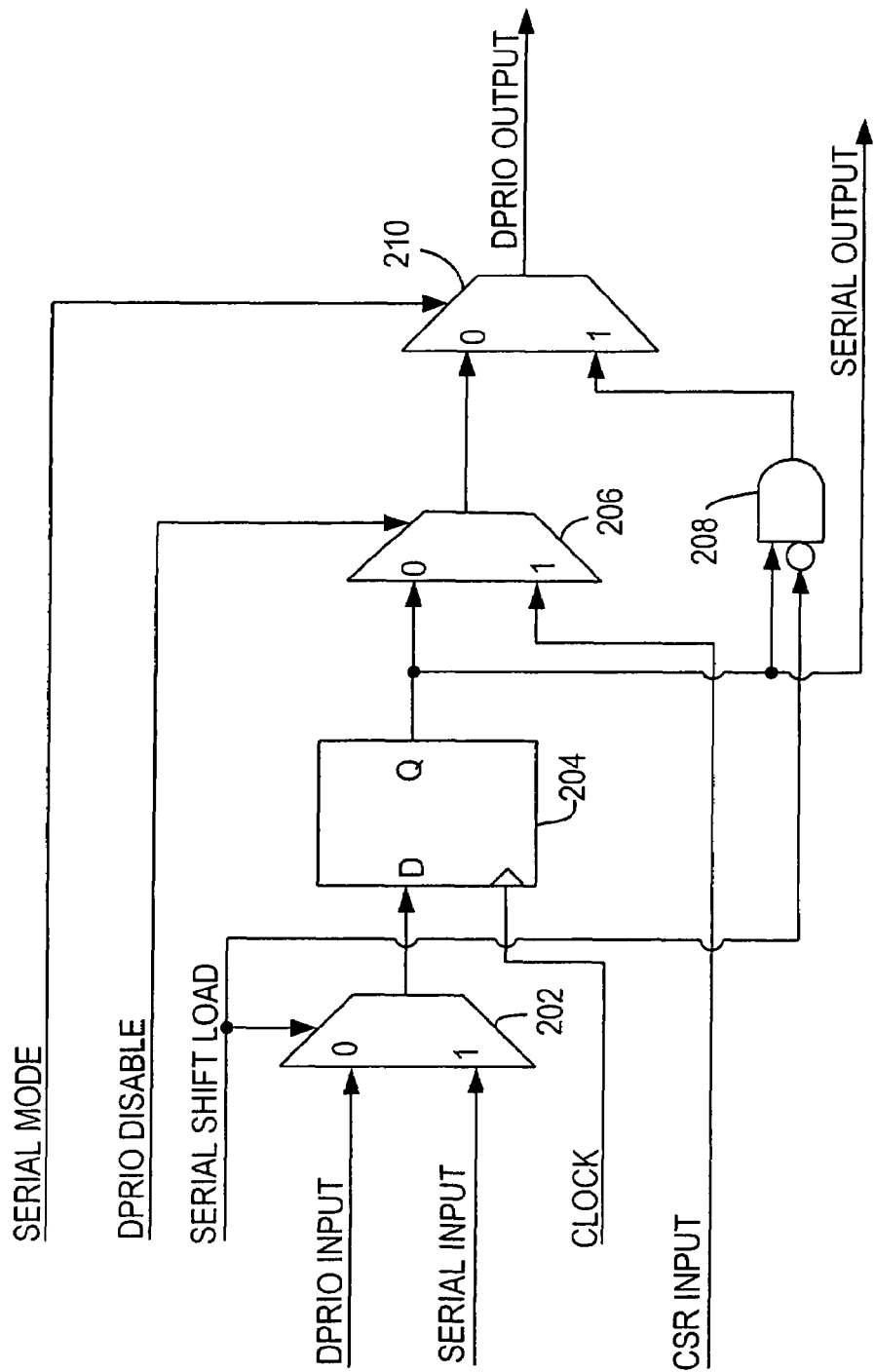
FIG. 2 is a simplified schematic diagram of an illustrative embodiment of a representative portion of the DPRIO interface circuitry in accordance with the invention.

FIG. 2 shows a simplified schematic diagram of an illustrative embodiment of a representative portion of the DPRIO interface circuitry in accordance with the invention. DPRIO circuitry 200 may support both CSR load mode and MDIO interface mode. Depending on the value of the serial shift load input, multiplexer 202 passes either the serial shift input signal or the DPRIO input signal to D flip-flop 204. D flip-flop 204 may be falling-edge, rising-edge, or both falling-edge and rising-edge triggered and stores either the serial input signal or the DPRIO input signal. The output of D flip-flop 204 is passed out of DPRIO circuitry 200 as the serial output signal. This signal is used as the serial in for the next register in the DPRIO register bank.

The output of D flip-flop 204 is also fed into multiplexer 206. Depending on the value of the DPRIO disable signal, multiplexer 206 either outputs the CSR input or the output of D flip-flop 204. Finally, the output of multiplexer 206 is fed into multiplexer 210, which outputs the DPRIO signal value when serial mode is disabled. This DPRIO output is typically stored in the DPRIO configuration register bank and is used to control operation of the hard IP block. If the serial mode control signal is asserted, the value of the DPRIO output signal is determined by AND gate 208. This gate receives the output of D flip-flop 204 and the inverse of the serial shift load input signal.

Figure 3:
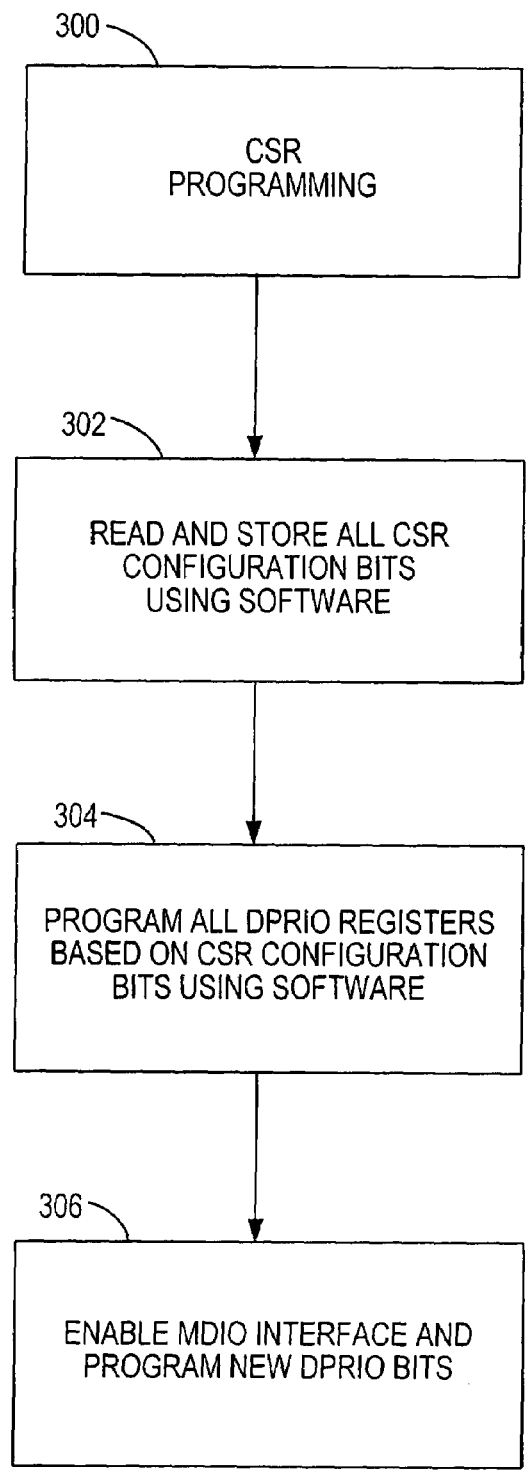
FIG. 3 is a flowchart depicting an illustrative method for programming the DPRIO interface in accordance with the invention.

An illustrative programming sequence for the DPRIO design of FIG. 2 is shown is FIG. 3 in accordance with the invention. At step 300, the FPGA control bank programs the CSR load data. In order to allow the FPGA end-user to use the MDIO interface, a software routine is required to read and store all the CSR configuration bits before the FPGA is initialized at step 302. After power up is completed, but before the FPGA is released to the user, the software routine programs all the DPRIO registers based on the CSR configuration bits read at step 302. Finally, at step 306, the FPGA is released to the user and the MDIO interface is enabled. The user may now reconfigure the values of the physical CRAMs using the DPRIO interface.

Because the software routine that is used to read all the CSR configuration bits and program the DPRIO configuration registers requires storage space and additional logic (i.e., FPGA resources) in order to store the CSR configuration bits, the preferred embodiment of the DPRIO interface in accordance with the invention does not utilize a supporting software routine. This hardware-only DPRIO solution not only saves storage space and hardware logic elements, but also eliminates any requirements on the end-user. In addition, FPGA power-up and configuration times can be reduced because the software routine runtime is eliminated. For complex hard IP blocks, such as a HSSI, faster power-up and configuration times are crucial to both end-users and dependent applications.

Figure 4:
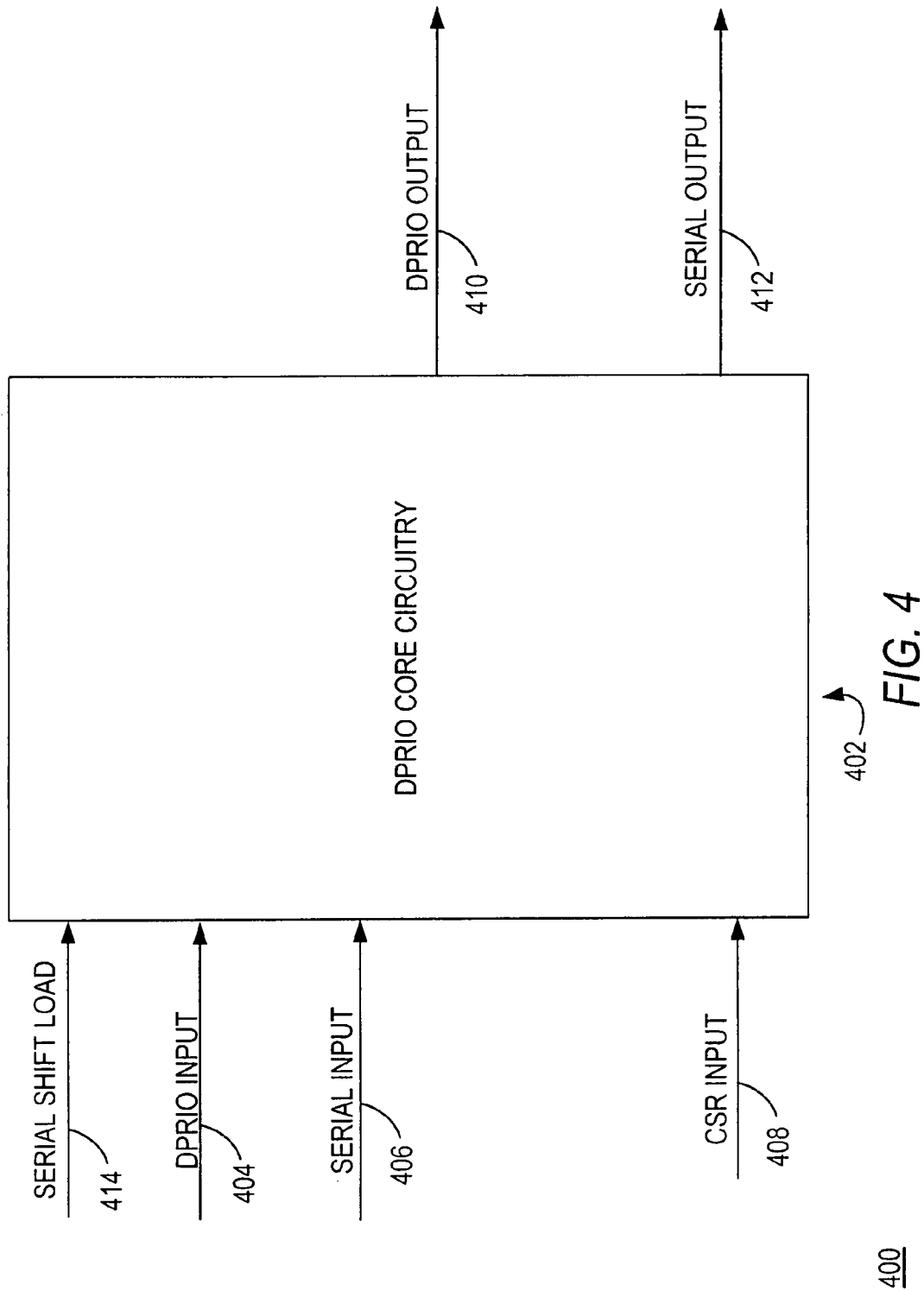
FIG. 4 is a simplified schematic block diagram of an illustrative hardware-only embodiment of a representative portion of the DPRIO interface circuitry in accordance with the invention.

FIG. 4 shows a simplified schematic block diagram of an illustrative hardware-only embodiment of a representative portion of the DPRIO interface circuitry in accordance with the invention. DPRIO core circuitry 402 takes four main inputs and outputs two main signals. DPRIO input 404 is the main signal input to the DPRIO. Serial input 406 is the serial signal input for use when the DPRIO is in serial mode. Serial shift load input 414 controls the loading of the DPRIO register bank. The last main input, CSR input 408, is the CSR configuration data input, which is controlled by the FPGA control block.

DPRIO core circuitry 402 outputs both the DPRIO register signals to program the DPRIO registers and the serial out shift signal to the hard IP block. Serial output 412 is the shift in for the next register in the DPRIO register bank. DPRIO output 410, which is routed into the hard IP block of the FPGA, is the register signal used to control the operation of the hard IP block.

Figure 5:
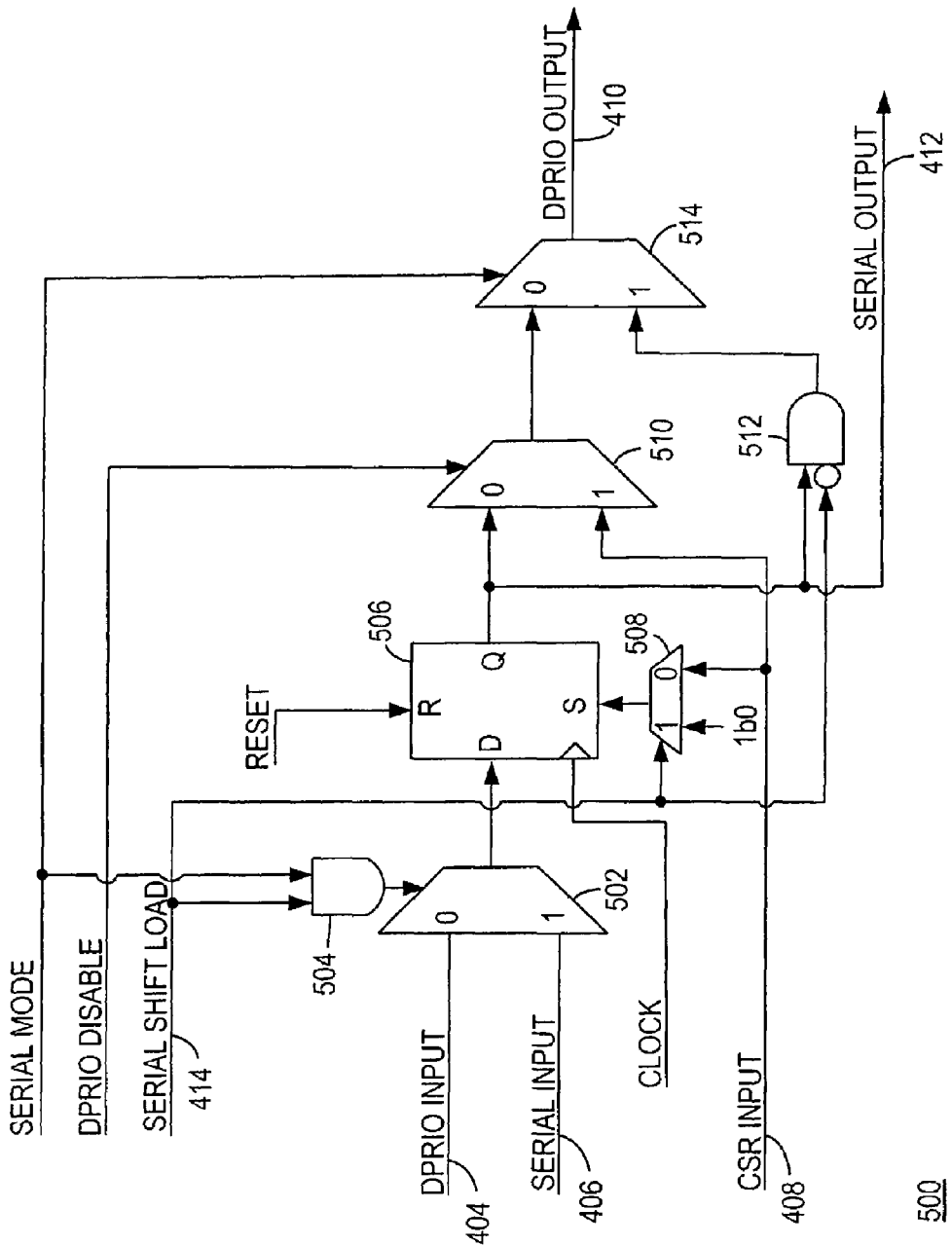
FIG. 5 is a simplified schematic diagram of an illustrative embodiment of a portion of the circuitry shown in FIG. 4 in accordance with the invention.

FIG. 5 shows a simplified schematic diagram of an illustrative embodiment of a portion of the circuitry shown in FIG. 4 in accordance with the invention. DPRIO circuitry 500 is similar to the DPRIO circuitry 200 of FIG. 2. The main differences between the two DPRIO embodiments are the set/reset signals on D flip-flop 506 and the addition of multiplexer 508 to support the set signal of D flip-flop 506. Another distinction is the addition of AND gate 504. The output of this gate is used to control input multiplexer 502. Using DPRIO circuitry 500, the serial shift load signal 414 may be toggled to load the current CRAM values and program the DPRIO registers with the CSR bits. Unlike DPRIO circuitry 200 of FIG. 2, no software routine is needed to read and store the CSR configuration bits or program the DPRIO registers based on the CSR configuration data. Rather, the set/reset signals on D flip-flop 506 and multiplexer 508 allow controlled loading of the DPRIO register banks through serial shift load signal 414. DPRIO circuitry 500 configures the hard IP block through the DPRIO registers and supports both CSR load mode and MDIO interface mode.

Similar to multiplexer 202 of DPRIO circuitry 200 (FIG. 2), multiplexer 502 of DPRIO circuitry 500 receives both the serial input signal 406 and DPRIO input signal 404. If both the serial mode control signal and serial shift load signal 414 are asserted, multiplexer 502 passes serial input signal 406 to D flip-flop 506. If either the serial mode control signal or serial shift load signal 414 is not asserted, multiplexer 502 passes DPRIO input signal 404 to D flip-flop 506.

D flip-flop 506 now has separate set and reset signals to control loading of the DPRIO register bank. The flip-flop's set and reset signals are asynchronous, level-triggered signals. When the set signal is asserted, D flip-flop 506 asserts its Q output. When the reset signal is asserted, D flip-flop 506 de-asserts its Q output. If desired, the reset signal may be asserted at FPGA initialization to clean up all the DPRIO registers. The set signal of D flip-flop 506 is controlled by multiplexer 508. The output of multiplexer 508 is selected by serial shift load signal 414 of DPRIO circuitry 500. In order for D flip-flop 506 to pass its D input to its Q output, both the set and reset signals of D flip-flop 506 must be low. When this condition occurs D flip-flop 506 acts like a traditional D flip-flop without set/reset signals. This occurs when both serial shift load signal 414 and CSR input signal 408 are low. Flip-flop 506, like flip-flop 204 (FIG. 2) may be rising-edge, falling-edge, or both rising-edge and falling-edge triggered. The output of D flip-flop 506 is passed out of DPRIO circuitry 500 as serial output 412.

Multiplexer 510 selects its output using the DPRIO disable control signal. If the DPRIO interface is not disabled (i.e. the DPRIO disable control signal is not asserted), multiplexer 510 selects the output of D flip-flop 506 to pass to multiplexer 514. Else, multiplexer 510 passes CSR input 408 to multiplexer 514. Finally, multiplexer 514 uses the serial mode control signal of DPRIO circuitry 500 to select either the output of multiplexer 510 or the output of AND gate 512. The selected signal is passed out of DPRIO circuitry 500 as DPRIO output 410.

Figure 6:
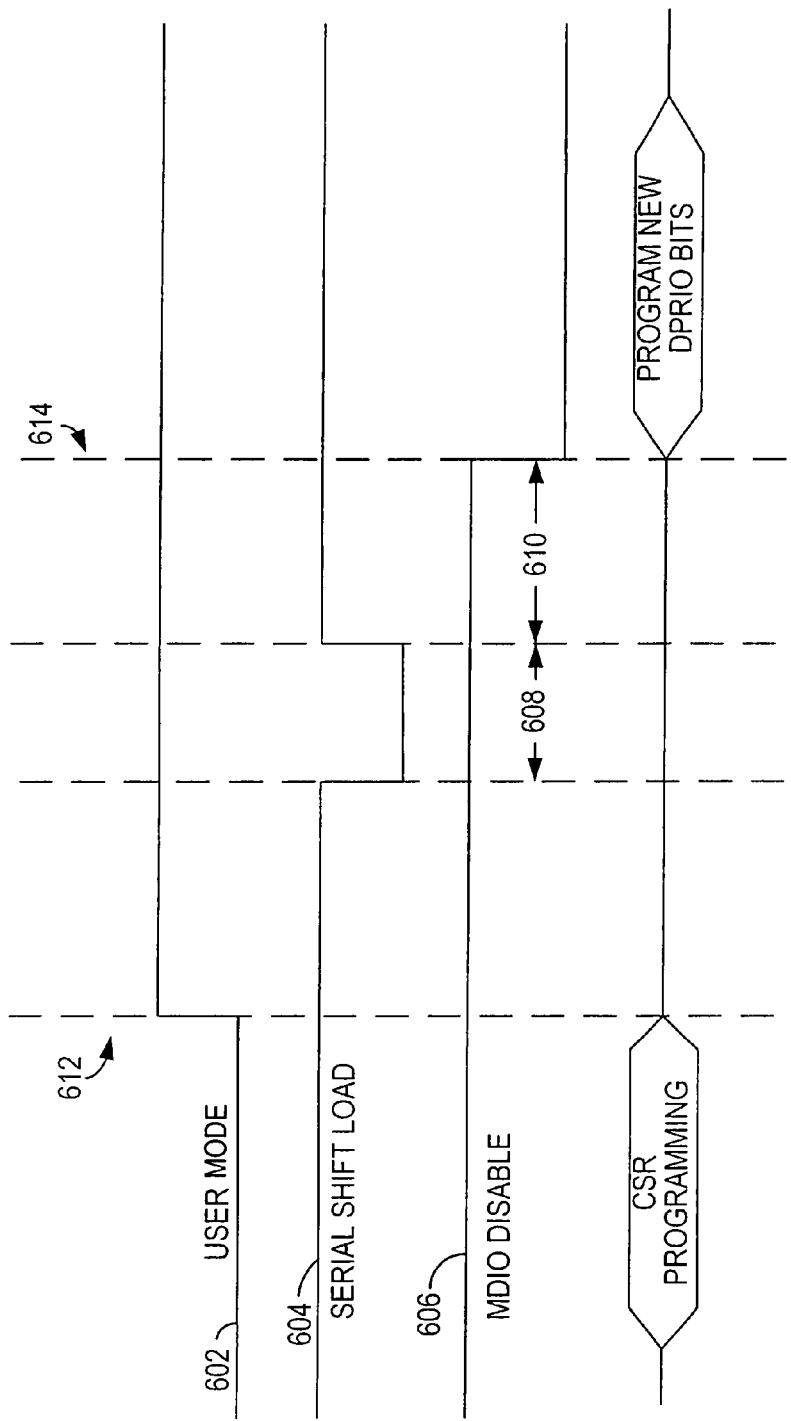
FIG. 6 is an illustrative timing diagram and illustrative power-up and programming sequence of the circuitry shown in FIG. 5 in accordance with the invention.

FIG. 6 illustrative timing diagram and illustrative power-up and programming sequence of the circuitry shown in FIG. 5 in accordance with the invention. User mode 602 defines when the FPGA is initialized and control is handed over to the FPGA end-user. The value of user mode 602 is high when the FPGA has completed power-up and initialization. As shown in FIG. 6, user mode 602 is low during CSR programming of the FPGA. The CSR configuration data is programmed and controlled by the FPGA control bank. During this time, control of the FPGA is not released to the end-user.

Serial shift load 604 represents serial shift load signal 414 of DPRIO circuitry 500 (FIG. 5). By controlling this signal, the DPRIO interface may effect loading and unloading of the DPRIO registers with the CSR value. MDIO disable 606 represents when the MDIO interface is available to the user. When MDIO disable 606 is high, the interface is not available. When the signal goes low, the user may use the MDIO interface to control or reconfigure the hard IP block using the DPRIO interface.

At some time 612 after CSR programming is complete, the FPGA enters user mode. This is represented in FIG. 6 when user mode 602 is high. At this point, the FPGA is released to the user. However, the MDIO interface is still disabled, as represented by MDIO disable 606. Some time after time 612, the user may toggle serial shift load 604. Referring to FIG. 5, the toggling of serial shift load 604 causes the output of multiplexer 508 to depend on the value of CSR input 408. During this time, the CSR initialization data is read in through CSR input 408 and is used to control the set signal of D flip-flop 506. This may effect controlled loading of the DPRIO registers based on the CSR input value. When serial shift load 604 is asserted again, the loading of the CSR bits may stop. Finally, after some time 610, the MDIO interface is enabled at time 614. When the user de-asserts the MDIO disable signal to enable the DPRIO interface, the output to the DPRIO registers may be cleared, and the user may program new DPRIO bits to reconfigure the CRAMs. Thus, the hard IP block may be successfully reconfigured using the DPRIO interface.

To program the CRAMs using serial mode, the user first asserts the serial mode signal. Referring to FIG. 5, to shift in serial data through serial input 406, the user also asserts serial shift load signal 414. During the shifting process, DPRIO output 410 is low. After shifting in the correct number of bits, the user de-asserts serial shift load signal 414 to load the CRAM values. Using the serial load mode, users may not be able to dynamically reconfigure the CRAMs.

Figure 7:
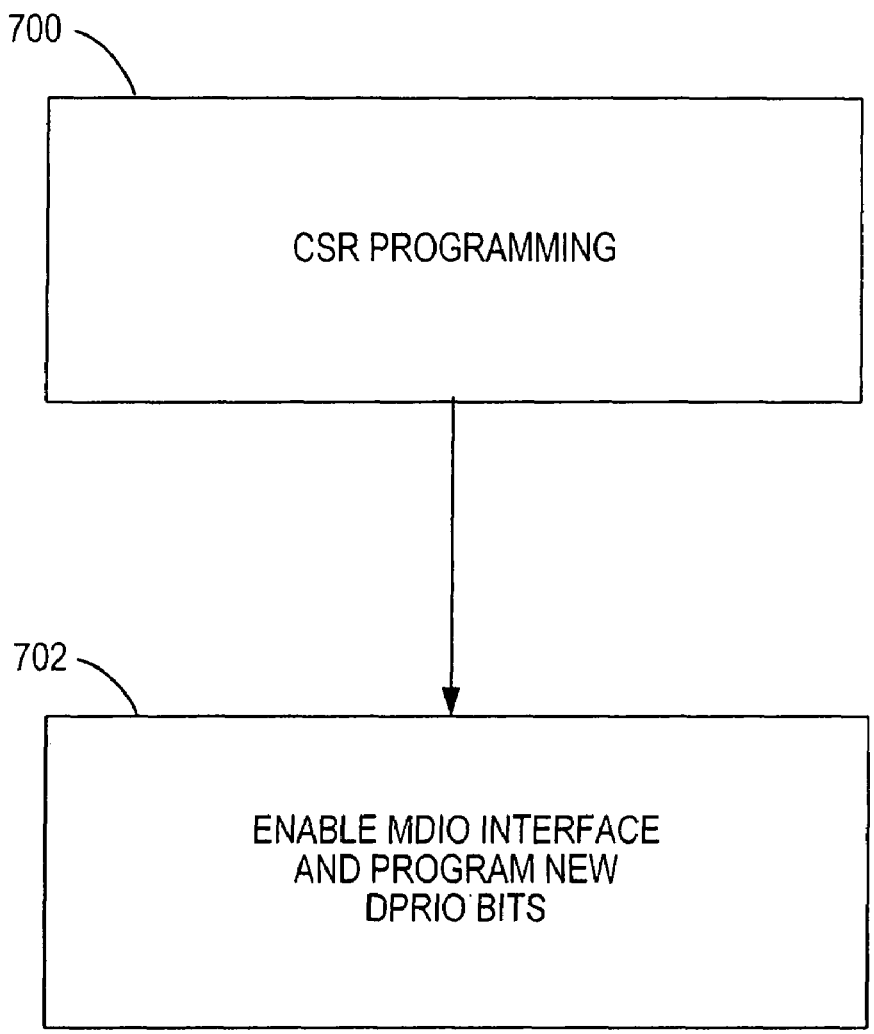
FIG. 7 is a flowchart depicting an illustrative method for programming the DPRIO interface of FIG. 4 in accordance with the invention.

FIG. 7 is a flowchart depicting an illustrative method for programming the DPRIO interface of FIG. 4 in accordance with the invention. Because of the controlled loading of the DPRIO registers using serial shift load 604 (FIG. 6), the software routine required to read and store all the CSR configuration bits and program the bits into the DPRIO registers is no longer needed. This not only saves FPGA logic elements and storage requirements, but also reduces initialization and hard IP configuration times. In addition, all requirements on the FPGA end-user have now been eliminated. After CSR programming is complete at step 700, the MDIO interface is enabled. The user may then use the DPRIO interface to program new DPRIO bits into the DPRIO registers to configure the hard IP block. This interface is extremely user-friendly and virtually transparent to the end-user.

Figure 8:
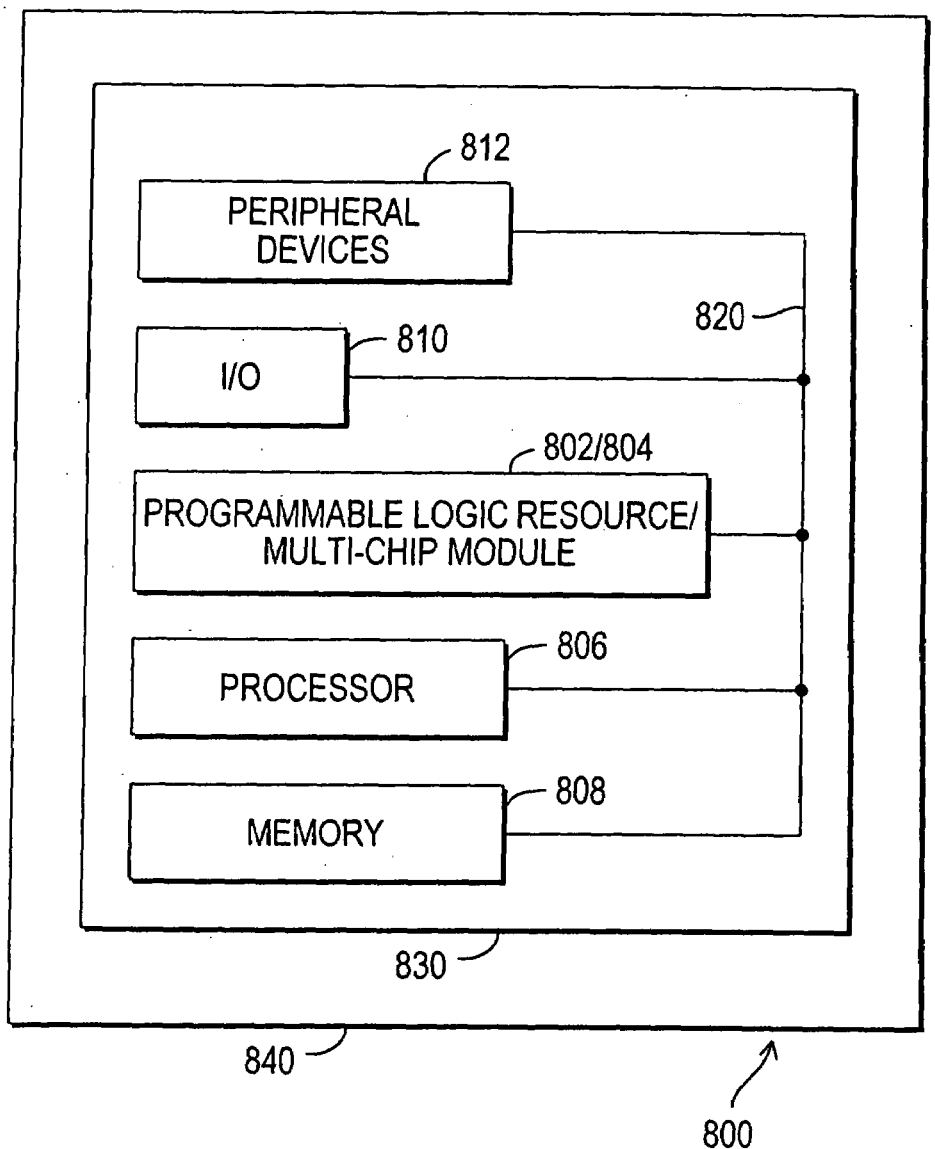
FIG. 8 is a simplified schematic block diagram of an illustrative system employing a programmable logic resource, multi-chop module, or other suitable device in accordance with the invention.

FIG. 8 illustrates programmable logic resource 802, multi-chip module 804, or other device (e.g., ASSP, ASIC, full-custom chip, dedicated chip), in accordance with embodiments of the invention in a data processing system. Data processing system 800 may include one or more of the following components: processor 806, memory 808, I/O circuitry 810, and peripheral devices 812. These components are coupled together by a system bus or other interconnections 820 and are populated on circuit board 830, which is contained in end-user system 840. For example, interconnections 820 may comprise standard PCI, PCI-X, or PCI Express interconnect technology. The DPRIO interface in accordance with the invention may be used to control and configure any hard IP in end-user system 840.

It will be understood that the foregoing is only illustrative of the principles of the invention, and that various modifications can be made by those skilled in the art without departing from the scope and spirit of the invention. For example, the hard IP HSSI application described herein is merely illustrative. The present invention may configure any hard IP block, which may be equally or better suited to the following claimed invention.

What is claimed is:

1. I/O circuitry for configuring a hard IP block comprising:
    means for receiving a register load signal for loading at least one register;
    means for receiving a register data signal;
    means for receiving data indicative of a CSR initialization value;
    means for programming at least a portion of the at least one register with the received data; and
    means for outputting the at least one register to the hard IP block.

2. The circuitry defined in claim 1 wherein the at least one register stores dynamic hard IP configuration data.

3. The circuitry defined in claim 1 wherein the at least one register stores static hard IP configuration data.

4. The circuitry defined in claim 1 wherein the hard IP block comprises a HSSI.

5. The circuitry defined in claim 1 wherein the CSR initialization value is controlled by a FPGA control block.

6. The circuitry defined in claim 1 wherein the register load signal is toggled by a user.

7. The circuitry defined in claim 1 wherein the means for programming is controlled by the register load signal.

8. I/O circuitry for configuring a hard IP block comprising:
    a multiplexer for receiving data indicative of a CSR initialization value; and
    at least one flip-flop with a set and reset signal for receiving a register data signal;
    wherein:
        the output of the multiplexer is selected by a register load signal for loading at least one register;
        the output of the multiplexer is connected to the set signal of the at least one flip-flop; and
        the at least one flip-flop is configured to output the CSR initialization value to the at least one register.

9. The circuitry defined in claim 8 wherein the at least one register stores dynamic hard IP configuration data.

10. The circuitry defined in claim 8 wherein the at least one register stores static hard IP configuration data.

11. The circuitry defined in claim 8 wherein the hard IP block comprises a HSSI.

12. The circuitry defined in claim 8 wherein the CSR initialization value is controlled by a FPGA control block.

13. The circuitry defined in claim 8 wherein the register load signal is toggled by a user.

14. A method for configuring a hard IP block using I/O circuitry comprising:

receiving a register load signal for loading at least one register;

receiving a register data signal;

receiving data indicative of a CSR initialization value;

programming the at least one register based on the received data; and outputting the at least one register to the hard IP block.

15. The method of claim 14 wherein the at least one register stores dynamic hard IP configuration data.

16. The method of claim 14 wherein the at least one register stores static hard IP configuration data.

17. The method of claim 14 wherein the hard IP block comprises a HSSI.

18. The method of claim 14 wherein the CSR initialization value is controlled by a FPGA control block.

19. The method of claim 14 further comprising:

toggling the register load signal to effect the programming step.

* * * * *